(12) United States Patent
Boscher

(10) Patent No.: US 11,622,450 B2
(45) Date of Patent: Apr. 4, 2023

(54) MARKING DEVICE FOR MARKING CIRCUIT BOARDS TESTED BY MEANS OF A TEST DEVICE

(71) Applicant: Ingun Prüfmittelbau GmbH, Constance (DE)

(72) Inventor: Bernd Boscher, Constance (DE)

(73) Assignee: Ingun Prüfmittelbau GmbH, Constance (DE)

( * ) Notice: Subject to any disclaimer, the term of this patent is extended or adjusted under 35 U.S.C. 154(b) by 239 days.

(21) Appl. No.: 17/091,035

(22) Filed: Nov. 6, 2020

(65) Prior Publication Data
US 2021/0136920 A1     May 6, 2021

(30) Foreign Application Priority Data

Nov. 6, 2019 (DE) ...................... 10 2019 129 972.1

(51) Int. Cl.
| | | |
|---|---|---|
| *G01R 31/00* | (2006.01) | |
| *H05K 3/00* | (2006.01) | |

(Continued)

(52) U.S. Cl.
CPC ....... *H05K 3/0044* (2013.01); *G01R 31/2806* (2013.01); *H01R 33/05* (2013.01); *H05K 1/0269* (2013.01); *H05K 2203/0121* (2013.01)

(58) Field of Classification Search
CPC ............ G01R 31/2806; G01R 31/2801; G01R 31/2831; G01R 31/316; G01R 1/07314; G01R 1/07342; G01R 1/067; G01R 1/06705; H05K 13/082; H05K 3/0044; H05K 2201/09936; H05K 1/0269; H05K 2203/0121; H05K 2203/0195; H01R 33/05
See application file for complete search history.

(56) References Cited

U.S. PATENT DOCUMENTS

| | | | |
|---|---|---|---|
| 4,568,879 A | * | 2/1986 | Nakamura ........... G01R 31/316 324/759.02 |
| 5,416,428 A | | 5/1995 | Swart |

(Continued)

FOREIGN PATENT DOCUMENTS

DE        4404115 C2     7/1999

*Primary Examiner* — Thang X Le
(74) *Attorney, Agent, or Firm* — Bachman & LaPointe, P.C.

(57) ABSTRACT

The invention relates to a marking device (02) for marking circuit boards (04) tested by means of a test device (01, 08), wherein the marking device (02) can be fixed to the test device (01, 08) in a defined target position, and wherein the marking device (02) has a marking member (06) which can engage the surface (05) of a circuit board (04), and wherein the marking member (06) can be driven by a drive mechanism (16) in order to apply a marking to the surface (05) of the circuit board (04) by an operating movement of the marking member (06) depending on the test result. The marking device (02) includes a fixation module (10) and a quick change module (11), wherein the marking device (02) can be fixed to the test device (01, 08) in the defined target position by means of the fixation module (10), and wherein the quick change module (11) includes the marking member (06) and the drive mechanism (16), and wherein the quick change module (11) can be replaced without removing the fixation module (10).

13 Claims, 8 Drawing Sheets

(51) Int. Cl.
  *H01R 33/05*     (2006.01)
  *G01R 31/28*     (2006.01)
  *H05K 1/02*      (2006.01)

(56) References Cited

U.S. PATENT DOCUMENTS

| | | | | |
|---|---|---|---|---|
| 5,523,698 | A * | 6/1996 | Antonello | H05K 13/082 |
| | | | | 324/759.02 |
| 6,642,708 | B1 * | 11/2003 | Dragan | G01R 1/0408 |
| | | | | 324/759.02 |
| 7,243,038 | B2 * | 7/2007 | Dowland | G01R 31/2808 |
| | | | | 702/115 |
| 9,733,299 | B2 * | 8/2017 | Ota | G01R 1/07357 |
| 2007/0161153 | A1 * | 7/2007 | Kwon | H01L 21/561 |
| | | | | 257/E21.503 |

* cited by examiner

MARKING DEVICE FOR MARKING CIRCUIT BOARDS TESTED BY MEANS OF A TEST DEVICE

BACKGROUND OF THE INVENTION

The invention relates to a marking device for marking circuit boards tested by means of a test device.

From DE 44 04 115 C2, a test device for testing circuit boards is known. A marking device is mounted on said test device, the marking device, together with the test fingers of the test device, being brought into contact with the circuit board to be tested. After the completion of the test by means of the test device, a marking can be applied to the circuit board depending on the test result, the marking the fulfillment of the defined test criteria. To this end, a marking member is provided on the marking device, the tip of the marking member engaging the surface of the circuit board. Furthermore, the marking device comprises a drive mechanism by means of which the marking member can be driven in a rotational manner. If a marking is to be applied to the circuit board, the marking member is driven in a rotational manner by means of the drive mechanism after it has come into contact with the surface of the circuit board and a circular ring is thus carved as the marking on the surface of the circuit board.

As a result of the material-removing operation of the marking member during the application of the marking on the surface of the circuit board, inevitable wear occurs in the operation zone of the marking member. If said wear exceeds a specified wear limit, the marking member has to be replaced in order to be able to continue to reliably apply markings to the circuit boards. In the known marking devices, the entire marking device has to be removed from the test device in order to replace the marking member. The marking device can then be clamped in a clamping device so that the marking member can be removed by means of suitable tools and can be replaced by a new marking member. In a subsequent step, the marking device has to be reinstalled in the test device and be precisely adjusted. The disadvantage of this way of replacing the marking members is that the removal of the marking device, the subsequent replacement of the marking member and the subsequent reinstallation of the marking device in the test device including the required adjustment is extremely time-consuming. During the required removal and installation work for replacing the marking member, the entire test device is shut down and cannot continue to be used.

SUMMARY OF THE INVENTION

Starting from said state of the art, the object of the present invention is to propose a new marking device by means of which the downtimes during the replacement of the marking member can be reduced.

Said object is attained by a marking device as disclosed herein.

Advantageous embodiments of the invention are also disclosed herein and in the dependent claims.

The idea of the marking device according to the invention is that the marking device comprises a fixation module and a quick change module. The function of the fixation module is to fix the marking device to the test device in a defined target position. The quick change module comprises the marking member and the drive mechanism and can preferably be separated from the fixation module without using tools. When the marking member reaches the specified wear limit, the marking member can be replaced by removing the quick change module comprising the worn marking member from the fixation module and replacing it by another quick change module comprising a new marking member. Since the fixation module itself does not have to be removed from the test device and, in particular, tool-free removal of the quick change module is made possible, the undesired downtime for the replacement of the worn marking member is significantly reduced.

The way in which the marking member transfers its operating movement to the surface of the circuit board in order to apply the desired marking is generally arbitrary. The marking member can preferably be driven in a rotational manner by means of the drive mechanism, the marking member thus applying a circular or circle-line-shaped marking to the surface of the circuit device.

The structural design of the fixation module is generally arbitrary. According to a preferred embodiment, the fixation module is realized in the manner of a fixation sleeve which is open on one side. The quick change module is then pulled out on the open side of the fixation module in order to replace a worn marking member and a quick change module comprising a new marking member is inserted into the fixation sleeve through the open side. The inner dimensions of the fixation sleeve and the outer dimensions of the quick change module are to match in such a manner that the outer circumference of the quick change module comes into contact with the inner circumference of the fixation sleeve without play. This readily ensures a fit of the quick change module in the fixation sleeve without play; merely an axial fastening has to be provided for a fit of the quick change module in the fixation module which allows the marking device to be operated, the axial fastening preventing the quick change module from slipping out through the open side of the fixation sleeve.

In order to be able to fix the fixation module in a simple manner and in the correct position in a test device, a fixation thread is preferably provided on at least part of the outer circumference of the fixation module. When said fixation thread is provided, the fixation module can either be directly screwed into a corresponding thread on the test device or be fixed in a through bore of the test device using fixation nuts.

A particularly simple design of the quick change module results if the quick change module has a cylindrical shape and can thus be inserted without play into a fixation module which has a cylindrical inner diameter. In order to be able to apply the torques required for the application of the marking to the surface of the circuit board, an anti-rotation element is to be provided on the inner circumference of the fixation module in this case, the anti-rotation element engaging the outer circumference of the quick change module in a form-fitting manner. For example, the anti-rotation element can be a nose or groove which can be secured in a form-fitting manner.

The drive energy required for the operation of the marking device can be provided either electrically or pneumatically. If the drive mechanism in the quick change module is driven electrically, corresponding contact elements which can be separated in a simple manner when the quick change module is removed must be provided for the transmission of the electrical drive energy. To this end, a preferred embodiment provides that two contact elements are provided at each of the fixation module and the quick change module. These contact elements are disposed in such a manner that they can be contacted in pairs in an electrically conductive manner by inserting the quick change module into the fixation module.

For the unproblematic contacting of the contact elements, it is necessary that they come into contact with one another by means of a contact surface as large as possible in the end position. If, for example, the quick change module is cylindrical, it can be inserted into the cylindrical fixation sleeve in different angular positions. However, in order to allow for a reliable contacting of two associated contact elements irrespective of a specific angle, it is particularly advantageous if a first contact element is disposed on the outer circumference of the quick change module and the associated second contact element is disposed on the inner circumference of the fixation sleeve. Additionally, it is necessary that the first contact element and/or the second contact element surround the entire circumference. In this way, the cylindrical quick change module can be inserted into the cylindrical fixation sleeve in any angular position. Since at least one contact element surrounds the entire outer circumference of the quick change module or the entire inner circumference of the fixation sleeve, a contacting of the two contact elements is readily ensured despite the arbitrary rotation angle between the quick change module and the fixation sleeve. Another option for the contacting of two contact elements associated to each other in pairs irrespective of the rotation angle is that a third contact element is disposed in the center of the end face of the quick change module and the associated fourth contact element is disposed in the center of the closed end of the fixation sleeve. As a result of the centrally symmetrical disposition on the end face of the quick change module and on the closed end of the fixation sleeve, a twisting of the quick change module relative to the fixation sleeve does not affect the association of the two contact elements. As a result, the user can thus insert the quick change module into the fixation sleeve without precisely aligning the rotation angle relative to the fixation sleeve and can establish the required contacts between the contact elements by fixing the quick change module in its final position. As a result, separate assembly works for establishing the electrical contact between the quick change module and the fixation sleeve are no longer necessary.

As explained above, the quick change module merely has to be axially secured in the insertion direction for the fixation of the quick change module, in particular if a cylindrical quick change module is used which can be inserted without play into a cylindrical fixation sleeve. According to a preferred embodiment, said axial securing of the quick change module in the fixation sleeve is realized by two contact elements associated with one another. To this end, the two contact elements form a plug contact pair. When the quick change module is installed in the fixation sleeve, one contact element is inserted into the associated other contact element. By suitable elastic deformation or by the frictional connection between the two contact elements, a holding force by means of which the quick change module is axially secured in the fixation sleeve can be transmitted between the quick change module and the fixation sleeve. In order to realize a plug contact pair for the axial securing of the quick change module in the fixation sleeve, the third contact element is particularly suitable because of its disposition in the center of the end face of the quick change module. With respect to the design, the third contact element can preferably be realized in the shape of a mushroom or of a sphere. The associated fourth contact element is preferably realized by a cylindrical recess. By inserting the third contact element realized in the shape of a mushroom or a sphere into the cylindrical fourth contact element, the required frictional force can be readily applied between the quick change module and the fixation sleeve.

In order to realize a frictional force as defined as possible between the fixation sleeve and the quick change module in the plug contact pair, the third contact element preferably has at least two, in particular four, contact springs which are elastically hinged. By the elastic spring-back of the contact springs, a tolerance between the cylindrical fourth contact element and the mushroom-shaped or spherical contact element can be easily compensated. In order to be able to readily operate the marking device at different supply voltages, it is advantageous if the marking device comprises a corresponding ballast by means of which the electric supply voltage for driving the drive mechanism can be modified.

BRIEF DESCRIPTION OF THE DRAWINGS

An embodiment of the invention is shown in a schematized manner in the drawings and is explained below in an exemplary manner.

In the drawings.

DETAILED DESCRIPTION

Figure 1:
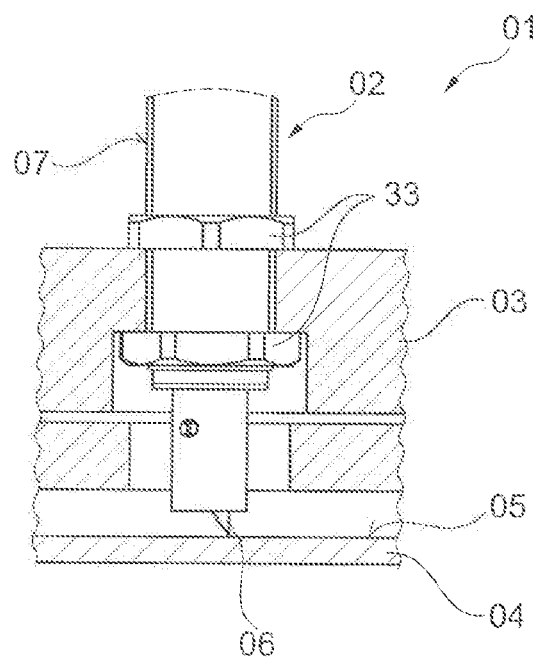
FIG. 1 shows a marking device installed in a first test device in a cross-sectional view.

FIG. 1 shows the section of a test device 01 to which a marking device 2 is fixed. Test device 01 is only partially shown in FIG. 1. A plurality of additional test pins is fixed to frame 03 of test device 01 in test device 01, wherein the test pins can come into contact with a circuit board 04 and allow automated testing of the electrical properties of circuit board 04. The contact pins of test device 01 are not shown in FIG. 1.

Depending on the test result of the electrical test of circuit board 04, a marking can be applied to surface 05 of circuit board 04 by means of marking device 02. To this end, a sharp-edged marking member 06 is provided on marking device 02, marking member 06 being elastically pressed against surface 05 of circuit board 04 in the axial direction. In order to produce marking member 06, a cylindrical pin is bevel-ground, a sharp-edged sickle thus being formed. Marking member 06 is secured against rotation by a pin which is pressed into a side. Instead of shown marking member 06, a sharp scratch graver (not shown) can also be used as the marking member. The tip of the scratch graver is disposed off-center in order to be able to carve a circular line by rotationally driving the scratch graver.

If, for example, circuit board 04 has met the specified electrical test criteria, a circular line can be engraved into surface 05 of circuit board 04 by rotationally driving marking member 06. The marking then symbolizes that circuit board 04 has met the specified test criteria.

In order to fix marking device 02 to frame 03, two fixation nuts 33 are used which engage an external thread 07 of marking device 02. When marking device 02 is installed on frame 03, marking device 02 is inserted through a through bore in frame 03 and is then fixed in the desired position by tightening the two fixation nuts 33.

Figure 2:
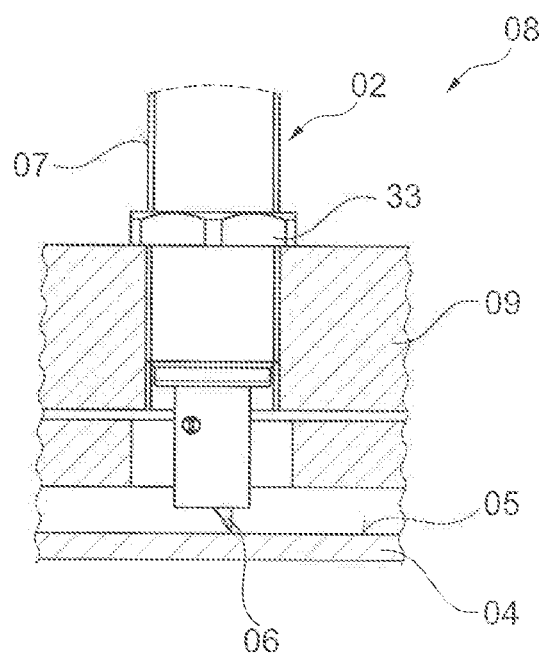
FIG. 2 shows the marking device according to FIG. 1 installed in a second test device in a cross-sectional view.

FIG. 2 shows the fixation of marking device 02 to a second test device 08. Frame 09 of test device 08 has an internal thread for the fixation of marking device 02, external thread 07 being screwed into the internal thread. Once marking member 06 can come into contact witch circuit board 04 at a sufficient preload, marking device 02 is secured by tightening fixation nut 33.

Figure 3:
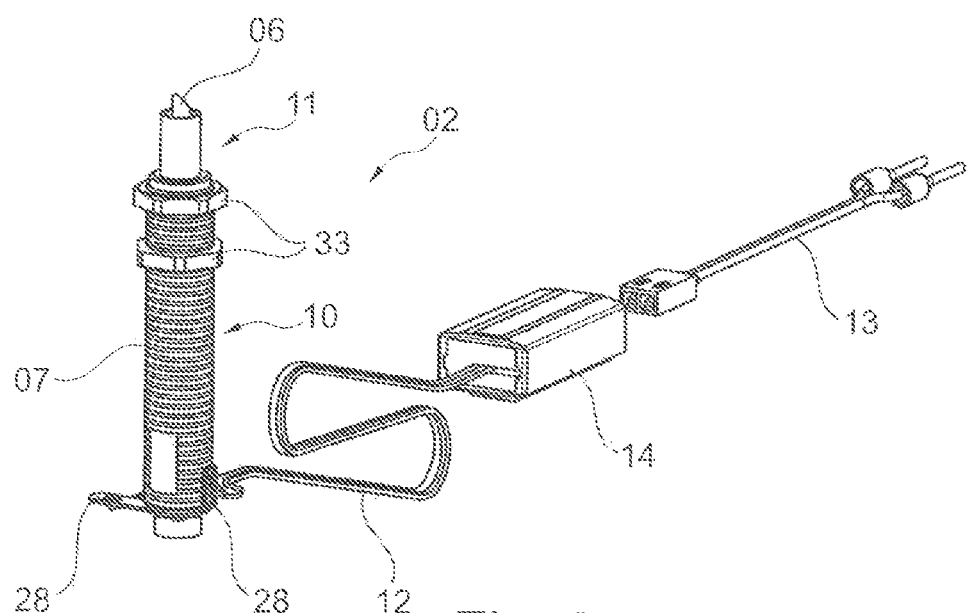
FIG. 3 shows the marking device according to FIG. 1 after the removal from the test device in a perspective lateral view.

FIG. 3 shows entire marking device 02 after the removal from the test device. Test device 02 comprises a fixation module 10 which has external thread 07 and the two fixation nuts 33 in order to fix marking device 02 to different test devices. Furthermore, marking device 02 comprises a quick change module 11, marking member 06 protruding from one end of quick change module 11. An electric drive mechanism is also installed in quick change module 11 and is used to rotationally drive marking member 06. In order to supply energy to the drive mechanism, marking device 02 can be connected to an electrical supply set by means of connection cables 12 and 13. A ballast 14 by means of which the supply voltage can be transformed in order to allow marking device 02 to be connected to supply networks which have different voltages is provided between connection cables 12 and 13.

Figure 4:
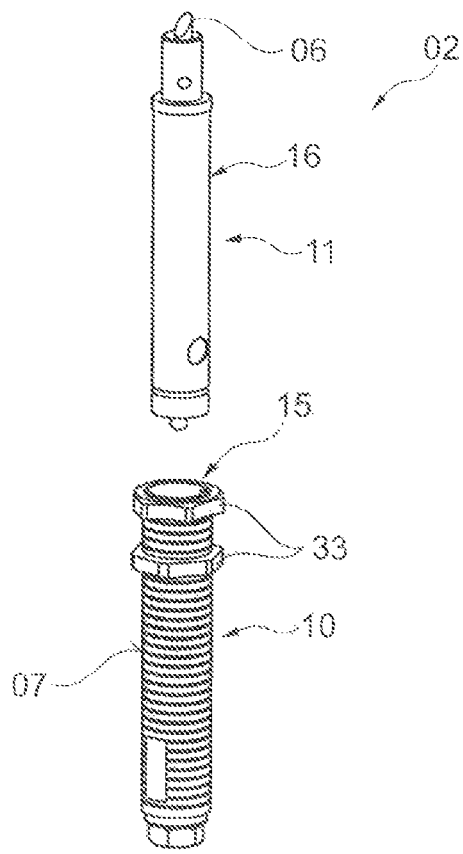
FIG. 4 shows the marking device according to FIG. 3 after the removal of the quick change module from the fixation module in a perspective lateral view.

FIG. 4 shows marking device 02 without connection cables 12 and 13 and without ballast 14. In FIG. 4, quick change module 11 is shown in the removed state. To this end, quick change module 11 is pulled out of fixation module 10, which is realized as a fixation sleeve, on open side 15. As a result, marking member 06 and electric drive mechanism 16 provided for rotationally driving marking member 06 are removed from marking device 02 by removing quick change module 11. If marking member 06 is worn out, quick change module 11 can thus simply be pulled out of marking device 02 and be replaced by another quick change module comprising new marking member 06 without removing fixation module 10. In this way, the required downtime for replacing marking member 06 can be significantly reduced. Once the quick change module is removed and replaced by another quick change module, worn marking member 06 of removed quick change module 11 can be replaced without time pressure and quick change module 11 can then be reinserted.

Figure 5:
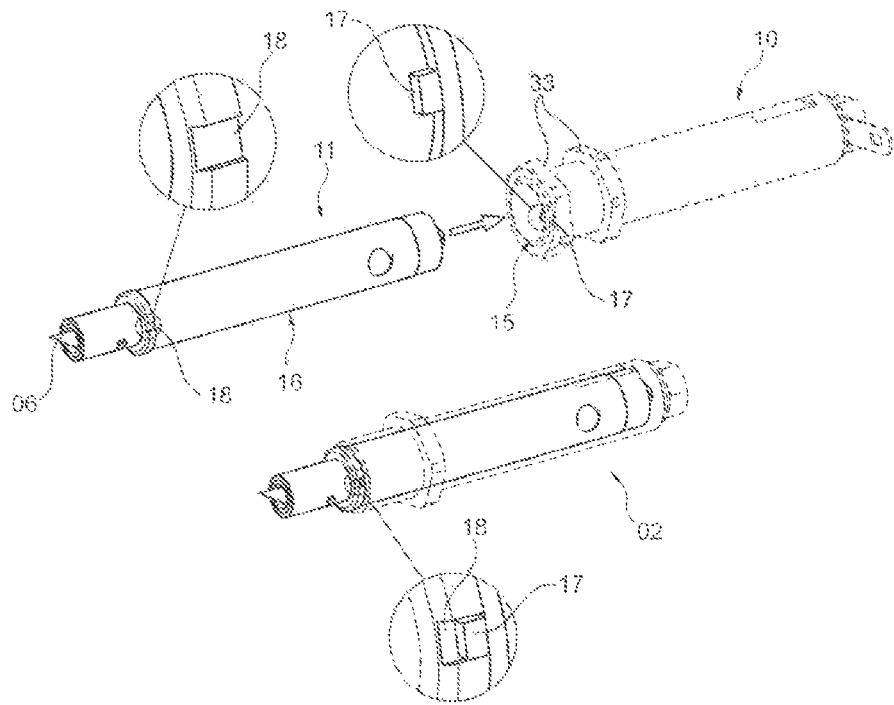
FIG. 5 shows the marking device according to FIG. 4 during installation of the quick change module in the fixation module in a perspective lateral view.

FIG. 5 shows marking device 02 before and after the installation of a new quick change module 11 in fixation module 10. An anti-rotation element 17 realized as a nose is located on open side 15 of fixation module 10, anti-rotation element 17 engaging into a groove 18 on the front end of electric drive mechanism 16 in the end position of quick change module 11 in fixation module 10. Quick change module 11 is supported in a rotational manner by fixation module 10 by means of the form-fitting connection between anti-rotation element 17 and groove 18, allowing the required torque to be applied to marking member 06 by driving electric drive mechanism 16.

Figure 6:
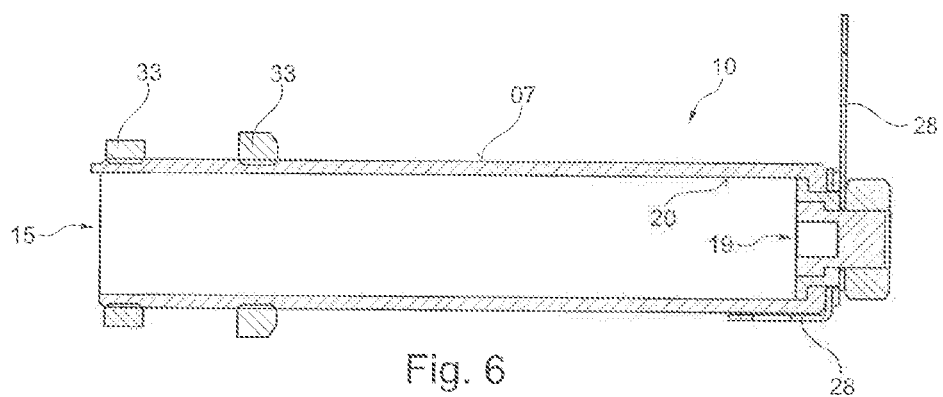
FIG. 6 shows the fixation module of the marking device according to FIG. 4 in a cross-sectional view.

FIG. 6 shows fixation module 10 in a cross-sectional view. As can be seen from the figure, fixation module 10 is realized in the manner of a cylindrical fixation sleeve which is open on one side. Quick change module 11 can be inserted into the fixation sleeve through open side 15. Fixation thread 07 is located on the outer circumference of the fixation sleeve. At the closed end of fixation module 10, two contact elements 19 and 20 are provided which can be contacted with contact elements 21 and 22 of quick change module 11 in an electrically conductive manner in order to supply electric drive mechanism 11 with the required voltage. The function of contact elements 19 to 22 is explained in more detail below.

Figure 7:
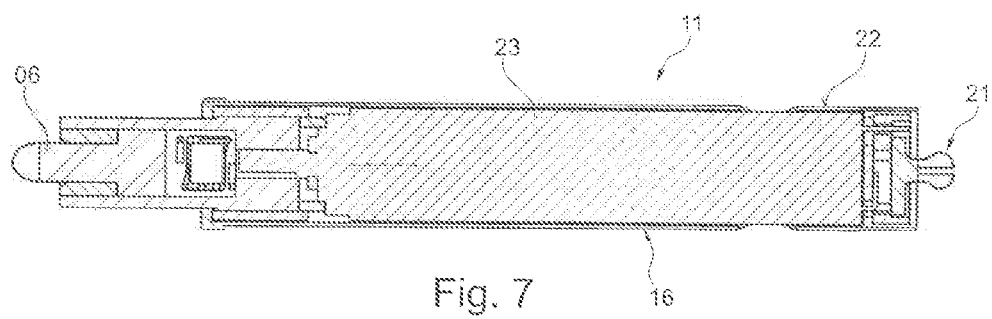
FIG. 7 shows the quick change module of the marking device according to FIG. 4 in a cross-sectional view.

FIG. 7 shows quick change module 11 in a schematized cross-sectional view. Marking member 06 is axially spring-loaded and can be rotationally driven by means of an electric drive motor 23. Electric drive motor 23 is connected to contact elements 20 and 19 via contact elements 21 and 22 and is thus supplied with the required voltage.

Figure 8:
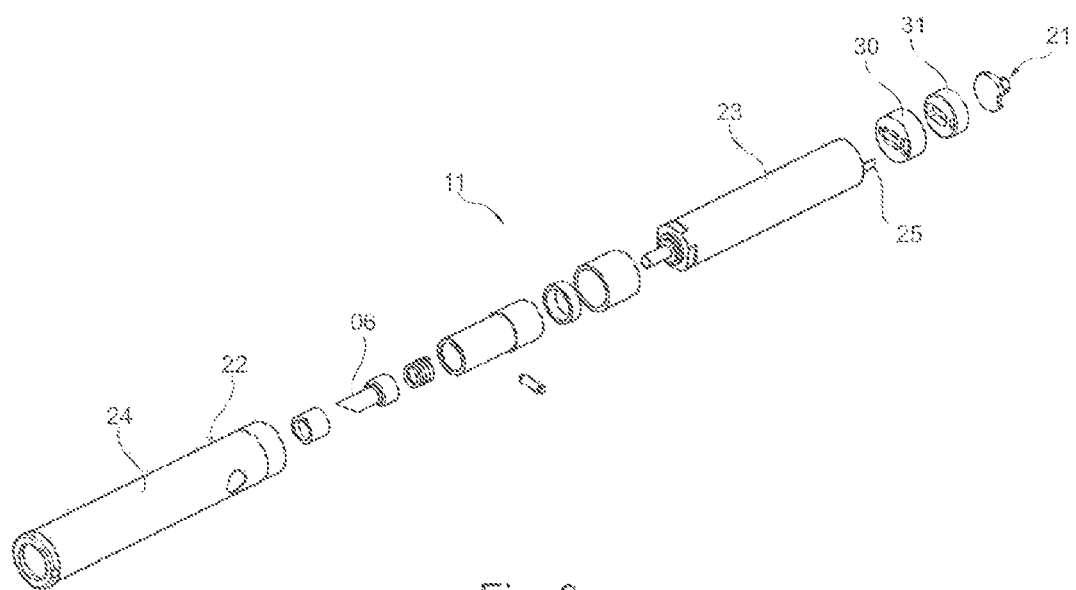
FIG. 8 shows the marking device according to FIG. 4 in an exploded view.

FIG. 8 shows quick change module 11 in an exploded view. All components of quick change module 11 are installed in a sleeve 24. The outer surface of sleeve 24 is used as contact element 22. The establishment of the contact between soldering tags 25 of drive motor 23 and the two contact elements 21 and 22 is explained in more detail below.

Figure 9:
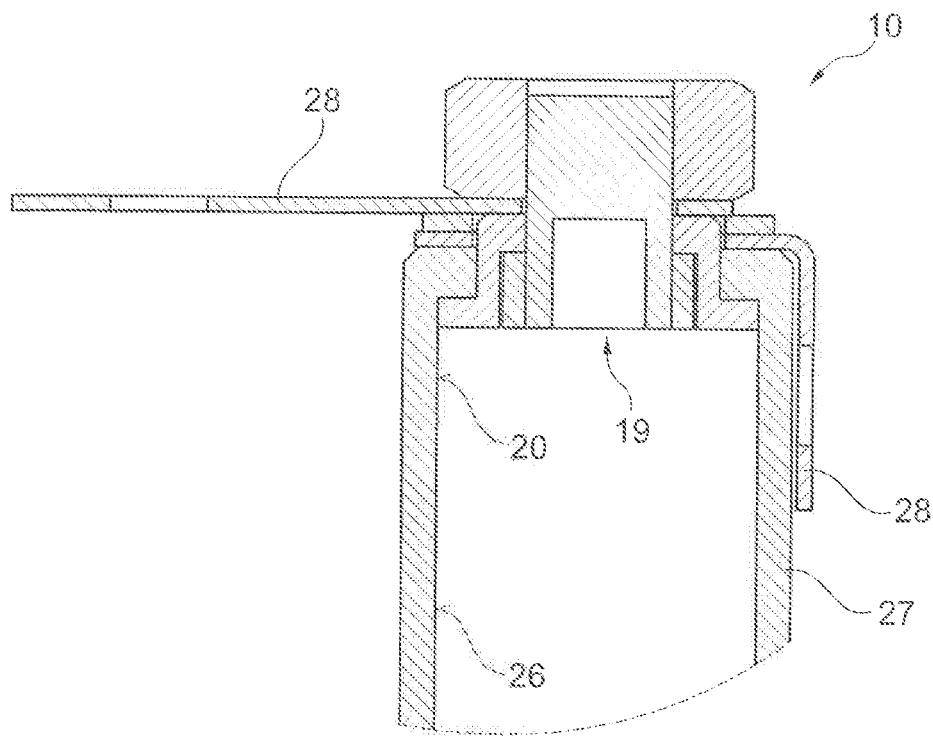
FIG. 9 shows the contact elements of the fixation module according to FIG. 6 in an enlarged sectional view.

FIG. 9 shows the closed end of fixation module 10 in an enlarged cross-sectional view. The entire inner circumference 26 in fixation module 10 is used as contact element 20. To this end, fixation sleeve 27, which is made of metal, is connected to connection cable 12 by means of contact tag 28. Additionally, the fixation module comprises contact element 19, which is realized in the manner of a cylindrical recess.

Figure 10:
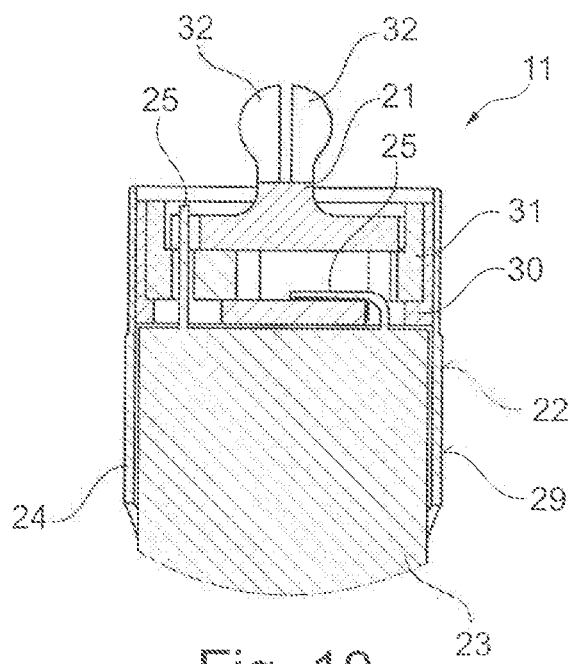
FIG. 10 shows the contact elements of the quick change module according to FIG. 7 in an enlarged sectional view.

FIG. 10 shows the rear end of quick change module 11. The entire outer circumference 29 of quick change module 11 is used as contact element 22. In order to produce contact element 22, one soldering tag 25 of electric drive motor 23 is electrically contacted by sleeve 24, which is made of metal. Said electrical contacting between sleeve 24 and soldering tag 25 is established by a contact element 30. After placing contact element 30 on the rear side of drive motor 23, soldering tag 25 is flipped and soldered. The outer circumference of contact element 30 itself comes into contact with the inner circumference of sleeve 24, whereby contact element 30 is electrically contacted.

Second soldering tag 25 of drive motor 23 is inserted through an insulator element 31 and is soldered to contact element 21. A short circuit between contact elements 21 and 22 is prevented by insulator element 31.

When quick change module 11 is installed in fixation module 10 by inserting sleeve 24 into fixation sleeve 27, the entire surface of outer circumference 29 comes into contact with inner circumference 26 and thus establishes the contact in pairs between contact elements 20 and 19. When the end position of quick change module 11 in fixation module 10 is reached, spherical contact element 21 is additionally inserted into cylindrical contact element 19 and is electrically contacted. Contact element 21 has four elastic contact springs 21 which are slightly pressed together elastically when contact element 21 is inserted into contact element 19. Quick change module 11 is axially secured in fixation module 10 by the frictional connection of contact springs 32 on the inner circumference of contact element 19.

Figure 11:
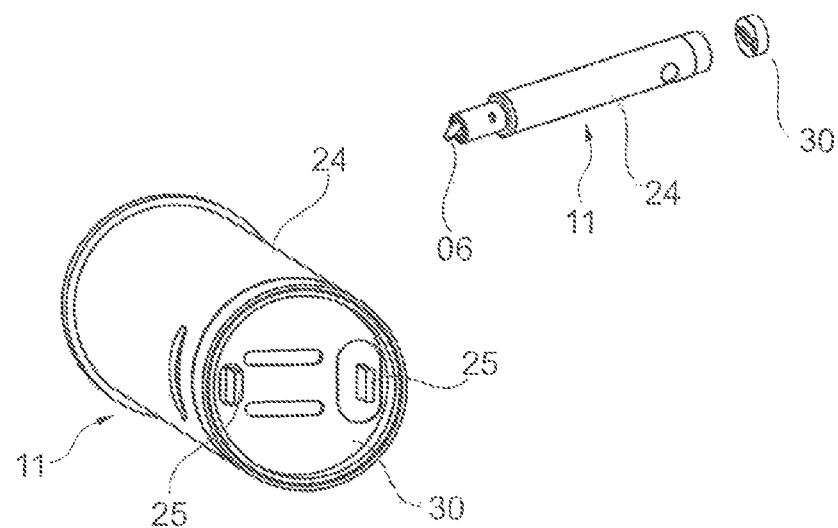
FIG. 11 shows the installation of the contact elements of the quick change module according to FIG. 10 in a first installation step in a perspective view.
Figure 12:
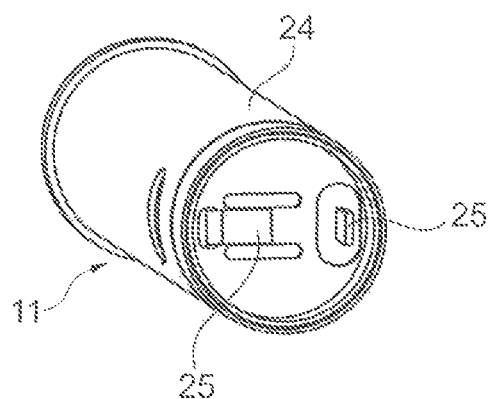
FIG. 12 shows the installation of the contact elements of the quick change module according to FIG. 10 in a second installation step in a perspective view.
Figure 13:
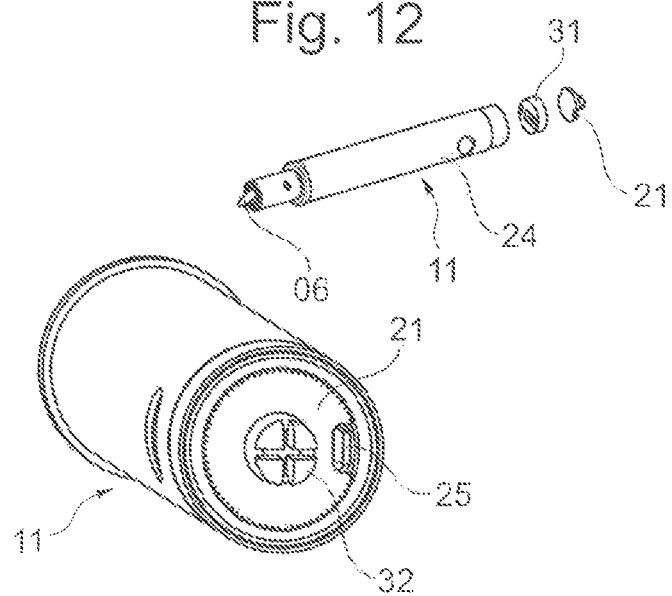
FIG. 13 shows the installation of the contact elements of the quick change module according to FIG. 10 in a third installation step in a perspective view.
Figure 14:
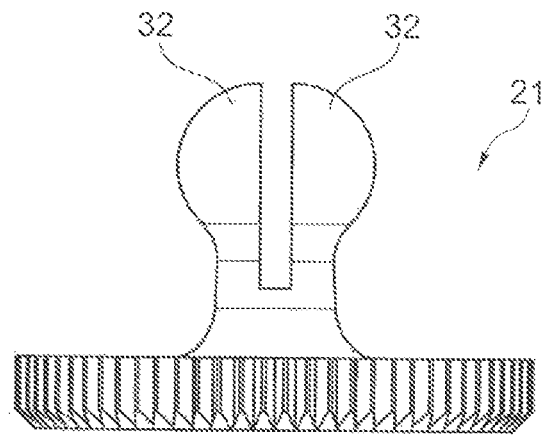
FIG. 14 shows the contact springs of the contact element of the quick change module according to FIG. 10 in a lateral view.

FIG. 11 to FIG. 13 show the installation of contact elements 21 and 22 during the production of quick change module 11 in a schematized manner. As a first step, contact element 30 is inserted into sleeve 24 from behind, the two soldering tags 25 of drive motor 23 thus penetrating the corresponding recesses in contact element 30. Left soldering tag 25 is then flipped (see FIG. 12) and soldered to contact element 30. Insulator element 31 and contact element 21 are then inserted into sleeve 24. As a final step, right soldering tag 25 is soldered to contact element 21 (see FIG. 13). FIG. 14 shows contact element 21 in a lateral view. A toothing or knurling is provided on the outer circumference of contact element 21 for the safe fixation of contact element 21 to insulator element 31.

Figure 15:
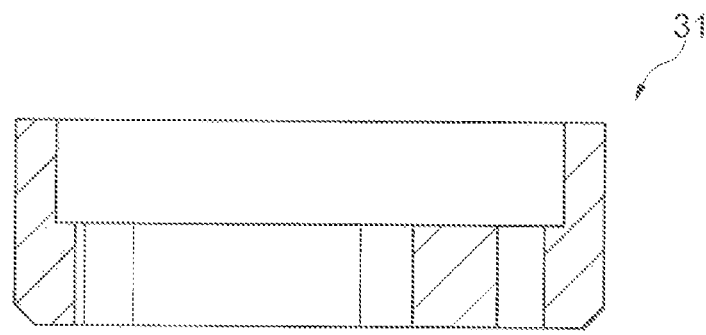
FIG. 15 shows the insulation part for producing the contact elements of the quick change module according to FIG. 10 in a cross-sectional view.

FIG. 15 shows insulator element 31 comprising the recesses for being penetrated by the soldering tags in a cross-sectional view.

Figure 16:
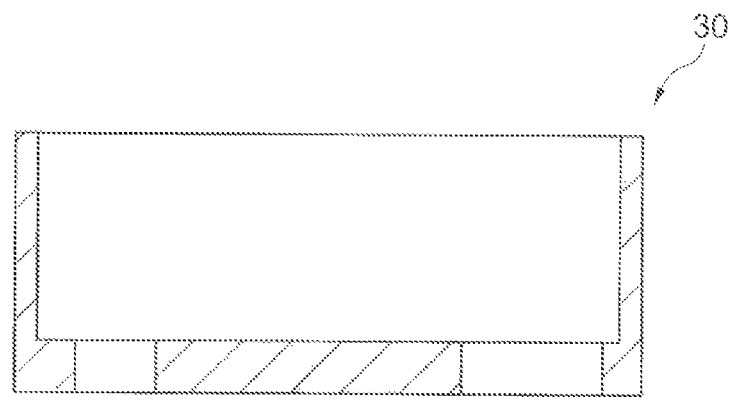
FIG. 16 shows the sleeve contact element for producing the contact elements of the quick change module according to FIG. 10 in a cross-sectional view.

FIG. 16 shows contact element 30 comprising the recesses for being penetrated by the soldering tags in a cross-sectional view.

REFERENCE SIGNS 01 test device
02 marking device
03 frame
04 circuit board
05 surface
06 marking member
07 fixation thread
08 test device
09 frame
10 fixation module
11 quick change module
12 connection cable
13 connection cable
14 ballast
15 open side
16 drive mechanism
17 anti-rotation element
18 groove
19 contact element
20 contact element
21 contact element
22 contact element
23 electric drive motor
24 sleeve
25 soldering tag
26 inner circumference
27 fixation sleeve
28 contact tag
29 outer circumference
30 contact element
31 insulator element
32 contact spring
33 fixation nut

The invention claimed is:

1. A marking device (02) for marking circuit boards (04) tested by means of a test device (01, 08), wherein the marking device (02) can be fixed to the test device (01, 08) in a defined target position, the marking device (02) comprises:
    a marking member (06) which can engage the surface (05) of a circuit board (04), the marking member (06) can be driven by a drive mechanism (16) in order to apply a marking to the surface (05) of the circuit board (04) by an operating movement of the marking member (06) depending on the test result;
    a fixation module (10) and a quick change module (11);
    the quick change module (11) includes the marking member (06) and the drive mechanism (16), and wherein the quick change module (11) can be replaced without removing the fixation module (10); and
    wherein the marking device (02) can be fixed to the test device (01, 08) in the defined target position by means of the fixation module (10).

2. The marking device according to claim 1, wherein the marking member (06) can be driven rotationally by means of the drive mechanism (16).

3. The marking device according to claim 1, wherein the fixation module (10) comprises a fixation sleeve (27) which is open on one side, wherein the quick change module (11) can be inserted into the fixation sleeve (27) through the open side (15), and wherein at least part of an outer circumference (29) of the quick change module (11) comes into contact with an inner circumference (26) of the fixation sleeve (27) without play.

4. The marking device according to claim 1, wherein a fixation thread (07) is provided on at least part of an outer circumference of the fixation module (10).

5. The marking device according to claim 1, wherein the quick change module (11) is cylindrical, an anti-rotation element (17) being provided on an inner circumference of the fixation module (10) and form-fittingly engaging an outer circumference of the quick change module (11).

6. The marking device according to claim 1, wherein the drive mechanism (16) in the quick change module (11) can be driven electrically, two contact elements (19, 20, 21, 22) being provided at each of the fixation module (10) and the quick change module (11), the contact elements (19, 20, 21, 22) being electrically conductively contacted by inserting the quick change module (11) into the fixation module (10).

7. The marking device according to claim 6, wherein a first contact element (22) is disposed at an outer circumference of the quick change module (11) and an associated second contact element (20) is disposed at an inner circumference of the fixation module (10), the first contact element (22) and/or the second contact element (20) surrounding the entire circumference.

8. The marking device according to claim 6, wherein a third contact element (21) is disposed a center of an end face of the quick change module (11) and an associated fourth contact element (19) is disposed in the center of the closed end of the fixation module (10).

9. The marking device according to claim 6, wherein two contact elements (19, 21) associated with one another form a plug contact pair which fixes the quick change module (11) in an insertion direction of the fixation module (10).

10. The marking device according to claim 8, wherein the third contact element (21) is mushroom-shaped or spherical and wherein an outer circumference of the third contact element (21) comes into electrically conductive contact with an inner circumference of a cylindrical recess which forms the fourth contact element (19).

11. The marking device according to claim 8, wherein the third contact element (21) has at least two contact springs (32) which are elastically hinged.

12. The marking device according to claim 11, wherein the third contact element (21) has at least four contact springs (32) which are elastically hinged.

13. The marking device according to claim 1, wherein the marking device (02) comprises a ballast (14) by means of which the electrical supply voltage for driving the drive mechanism (16) can be modified.

* * * * *